US012563715B2

(12) United States Patent
Anderson et al.

(10) Patent No.: US 12,563,715 B2
(45) Date of Patent: Feb. 24, 2026

(54) STACKED RANDOM-ACCESS-MEMORY WITH COMPLEMENTARY ADJACENT CELLS

(71) Applicant: INTERNATIONAL BUSINESS MACHINES CORPORATION, Armonk, NY (US)

(72) Inventors: Brent A. Anderson, Jericho, VT (US); Albert M. Chu, Nashua, NH (US); Junli Wang, Slingerlands, NY (US); Carl Radens, LaGrangeville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 710 days.

(21) Appl. No.: 17/930,096

(22) Filed: Sep. 7, 2022

(65) Prior Publication Data

US 2024/0081037 A1 Mar. 7, 2024

(51) Int. Cl.
H10B 10/00 (2023.01)
G11C 5/06 (2006.01)

(52) U.S. Cl.
CPC ............. H10B 10/15 (2023.02); G11C 5/063 (2013.01)

(58) Field of Classification Search
CPC ................................ H10B 10/15; G11C 5/063
USPC .......................................................... 257/379
See application file for complete search history.

(56) References Cited

U.S. PATENT DOCUMENTS 5,508,641 A * 4/1996 Appenzeller ........ H03K 19/215
326/24
6,834,003 B2 12/2004 Towler et al.

9,496,269 B1 * 11/2016 Liaw .................... H10D 84/853
9,870,815 B2 1/2018 Laiw
11,244,949 B2 2/2022 Weckx et al.
2004/0084676 A1 5/2004 Takaura et al.
2007/0189061 A1 8/2007 Buettner et al.
(Continued)

FOREIGN PATENT DOCUMENTS

CN 2718734 Y 8/2005
CN 110634870 A 12/2019
(Continued)

OTHER PUBLICATIONS

Gaillardon, "Vertically-stacked Silicon Nanowire Transistors with Controllable Polarity: a Robustness Study", 2013, 14th Latin American Test Workshop, IEEE, 6 pages.
(Continued)

*Primary Examiner* — Sheng-Bai Zhu

(74) *Attorney, Agent, or Firm* — Kimberly Zillig; Cantor Colburn LLP

(57) ABSTRACT

A field effect transistor (FET) cell structure of an integrated circuit (IC) is provided. The FET cell structure includes first and second adjacent cells. Each of the first and second adjacent cells spans a first layer and a second layer. The second layer is vertically stacked on the first layer. The first cell includes n-doped FETs (NFETs) on one of the first and second layers and p-doped FETs (PFETs) on another of the first and second layers. The second cell includes at least one of a number of NFETs on the one of the first and second layers differing from a number of the NFETs in the first cell and a number of PFETs on the another of the first and second layers differing from a number of the PFETs in the first cell.

11 Claims, 5 Drawing Sheets

(56)　　　　　References Cited

U.S. PATENT DOCUMENTS

| | | | | |
|---|---|---|---|---|
| 2014/0204656 | A1* | 7/2014 | Kumar | G11C 11/419 365/154 |
| 2015/0370948 | A1 | 12/2015 | Kawa et al. | |
| 2019/0259454 | A1 | 8/2019 | Yabuuchi | |
| 2020/0066732 | A1* | 2/2020 | Rubin | H10D 88/01 |
| 2020/0098756 | A1 | 3/2020 | Lilak et al. | |
| 2020/0161311 | A1 | 5/2020 | Pille et al. | |
| 2020/0286788 | A1 | 9/2020 | Xie et al. | |
| 2020/0365464 | A1* | 11/2020 | Sreenivasan | H01L 21/30604 |
| 2021/0210601 | A1 | 7/2021 | Pidin | |
| 2022/0102362 | A1 | 3/2022 | Chanemougame et al. | |
| 2022/0199471 | A1* | 6/2022 | Chhabra | H10D 88/00 |
| 2022/0208258 | A1 | 6/2022 | Zhu | |
| 2022/0246623 | A1* | 8/2022 | Hwang | H10D 84/0186 |

FOREIGN PATENT DOCUMENTS

| | | | |
|---|---|---|---|
| CN | 110943082 | A | 3/2020 |
| CN | 119856579 | A | 4/2025 |
| DE | 102020134620 | A1 | 3/2022 |
| EP | 4068358 | * | 10/2022 |
| EP | 4068358 | A2 * | 10/2022 ......... H01L 23/5286 |
| WO | 2021025797 | A1 | 2/2021 |
| WO | 2024/051444 | A1 | 3/2024 |

OTHER PUBLICATIONS

German Patent and Trademark Office, "Office Action," May 19, 2025, 14 Pages, DE Application No. 112023003713.2.

Intellectual Property Office, "Patents Act 1977: Search Report under Section 18(3)", May 29, 2025, 06 Pages, GB Application No. 2503344.0.

International Search Report; International Application No. PCT/CN2023/112809; International Filing Date: Aug. 14, 2023; Date of mailing: Nov. 16, 2023; 7 pages.

Intellectual Property Office, Patents Act 1977: Examination Report under Section 18(3), Apr. 15, 2025, 8 Pages, GB Application No. 2503344.0.

* cited by examiner

STACKED RANDOM-ACCESS-MEMORY WITH COMPLEMENTARY ADJACENT CELLS

BACKGROUND

The present invention generally relates to fabrication methods and resulting structures for semiconductor devices. More specifically, the present invention relates to stacked random-access-memory (RAM) with complementary adjacent cells.

Semiconductors and integrated circuit (IC) chips have become ubiquitous within many products, particularly as they continue to decrease in cost and size. Recently, there has been a continued desire to reduce the size of structural features and/or to provide a greater amount of structural features for a given chip size. This is because miniaturization, in general, allows for increased performance at lower power levels and lower cost. Present technology is at or approaching atomic level scaling of certain micro-devices such as logic gates, field-effect transistors (FETs), and capacitors.

For example, an array of FETs in a given cell structure can have a word line and two bit lines and can include first and second transistors that are each operably connected to the word line with one operably connected to one of the bit lines and the other is operably connected to the other bit line. The first and second transistors can be provided as n-doped access transistors or NFETs. The array in the given cell can further include first and second pull-up transistors that are operably interposed between the access transistors and connected to voltage terminals. The first and second pull-up transistors can be provided as p-doped pull-up transistors or PFETs. The array in the given cell can also include first and second pull-down transistors that are operably interposed between the access transistors and connected to ground terminals. The first and second pull-down transistors can be provided as NFETs.

The above-described cell structure may be provided as a static RAM cell structure or SRAM.

With the above-described cell structure, it is apparent that there are four total NFETs and two total PFETs. In conventional designs, arrangements of these four total NFETs and two total PFETs have not been optimized for spatial considerations among other issues. This presents a problem for achieving desired levels of miniaturization.

SUMMARY

Embodiments of the present invention are directed to a field effect transistor (FET) cell structure of an integrated circuit (IC). A non-limiting example of the FET cell structure includes first and second adjacent cells. Each of the first and second adjacent cells spans a first layer and a second layer. The second layer is vertically stacked on the first layer. The first cell includes n-doped FETs (NFETs) on one of the first and second layers and p-doped FETs (PFETs) on another of the first and second layers. The second cell includes at least one of a number of NFETs on the one of the first and second layers differing from a number of the NFETs in the first cell and a number of PFETs on the another of the first and second layers differing from a number of the PFETs in the first cell.

The first and second cells are vertically complementary with one another, which allows for the first and second cells to fit adjacently in an optimized manner. This optimal adjacency allows for desired levels of miniaturization for the IC.

In accordance with one or more additional or alternative embodiments of the present invention, the first and second cells are vertically complementary.

In accordance with one or more additional or alternative embodiments of the present invention, the first cell can have four NFETs and the second cell can have two NFETs or, more particularly, the first cell can have the four NFETs and two PFETs and the second cell can have the two NFETs and four PFETs.

In accordance with one or more additional or alternative embodiments of the present invention, the first and second cells are of a same function type or are separately operable.

In accordance with one or more additional or alternative embodiments of the present invention, the IC further includes first and second bit lines having different bit line voltage pre-charge capabilities, the first bit line being associated with the first cell and the second bit line being associated with the second cell.

In accordance with one or more additional or alternative embodiments of the present invention, the IC further includes first and second bit lines, the first bit line being associated with a front side or a back side of the first cell and the second bit line being associated with the back side or the front side of the second cell.

In accordance with one or more additional or alternative embodiments of the present invention, the IC further includes first and second different word lines having different word line voltages, the first word line being associated with the first cell and the second word line being associated with the second cell.

In accordance with one or more additional or alternative embodiments of the present invention, each of the first and second adjacent cells includes one or more additional layers and the first and second cells each further include complementary numbers of NFETs and PFETs on the one or more additional layers.

Embodiments of the present invention are directed to a field effect transistor (FET) cell structure of an integrated circuit (IC). A non-limiting example of the FET cell structure includes first and second cells, each spanning a first layer and a second layer vertically stacked on the first layer. The first cell includes n-doped FETs (NFETs) on one of the first and second layers and p-doped FETs (PFETs) on another of the first and second layers. The second cell includes at least one of a number of NFETs on the one of the first and second layers differing from a number of the NFETs in the first cell and a number of PFETs on the another of the first and second layers differing from a number of the PFETs in the first cell. The FET cell structure further includes additional electronic devices on the first and second layers and interposed between the first and second cells. The first and second cells and the additional electronic devices are vertically complementary.

With the first and second cells and the additional electronic devices being vertically complementary with one another, the first and second cells and the additional electronic devices can fit adjacently in an optimized manner. This optimal adjacency allows for desired levels of miniaturization for the IC.

In accordance with one or more additional or alternative embodiments of the present invention, the additional electronic devices are shared between the first and second cells.

Embodiments of the invention are directed to a cell structure of an integrated circuit (IC). A non-limiting example of the cell structure includes first and second vertically complementary and adjacent cells, each spanning a first layer and a second layer vertically stacked on the first layer. The first cell includes first electronic devices on one of the first and second layers and second electronic devices on another of the first and second layers. The second cell includes at least one of a number of first electronic devices on the one of the first and second layers differing from a number of the first electronic devices in the first cell and a number of second electronic devices on the another of the first and second layers differing from a number of the second electronic devices in the first cell.

With the first and second cells are being vertically complementary with one another, the first and second cells can fit adjacently in an optimized manner. This optimal adjacency allows for desired levels of miniaturization for the IC.

In accordance with one or more additional or alternative embodiments of the present invention, the first electronic devices include n-doped field effect transistors (NFETs) and the second electronic devices include p-doped field effect transistors (PFETs).

In accordance with one or more additional or alternative embodiments of the present invention, the cell structure is a static random-access-memory (SRAM) cell, the first electronic devices include transistors and the second electronic devices include resistors.

In accordance with one or more additional or alternative embodiments of the present invention, the cell structure is a ternary content addressable memory (TCAM) cell, the first electronic devices include transistors and the second electronic devices include capacitors.

In accordance with one or more additional or alternative embodiments of the present invention, the first and second cells are of a same function type or are separately operable.

In accordance with one or more additional or alternative embodiments of the present invention, the cell structure further includes first and second bit lines having different bit line voltage pre-charge capabilities, the first bit line being associated with the first cell and the second bit line being associated with the second cell.

In accordance with one or more additional or alternative embodiments of the present invention, the cell structure further includes first and second bit lines, the first bit line being associated with a front side or a back side of the first cell and the second bit line being associated with the back side or the front side of the second cell.

In accordance with one or more additional or alternative embodiments of the present invention, the cell structure further includes first and second different word lines having different word line voltages, the first word line being associated with the first cell and the second word line being associated with the second cell.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of the aspects of the invention, one or more embodiments of the invention address the above-described shortcomings and problems of the prior art by providing for a stacked cell structure of, for example, an SRAM, with complementary adjacent cells. This allows for arrangements of the numbers of NFETs and PFETs in a cell structure to be optimized for spatial considerations and facilitates achieving desired levels of miniaturization.

The above-described aspects of the invention address the shortcomings of the prior art by providing for an FET cell structure of an IC. The FET cell structure includes first and second adjacent cells, each of which spans a first layer and a second layer vertically stacked on the first layer. The first cell includes n-doped FETs (NFETs) on one of the first and second layers and p-doped FETs (PFETs) on another of the first and second layers. The second cell includes PFETs on the one of the first and second layers and NFETs on the other of the first and second layers.

As used herein, the terms FET, NFET and PFET can be used interchangeably with VTFETs, FINFETs, nanosheet FETs, etc., or combinations thereof. The terms FET, NFET and PFET will be used, however, for the purposes of clarity and brevity.

Figure 1:
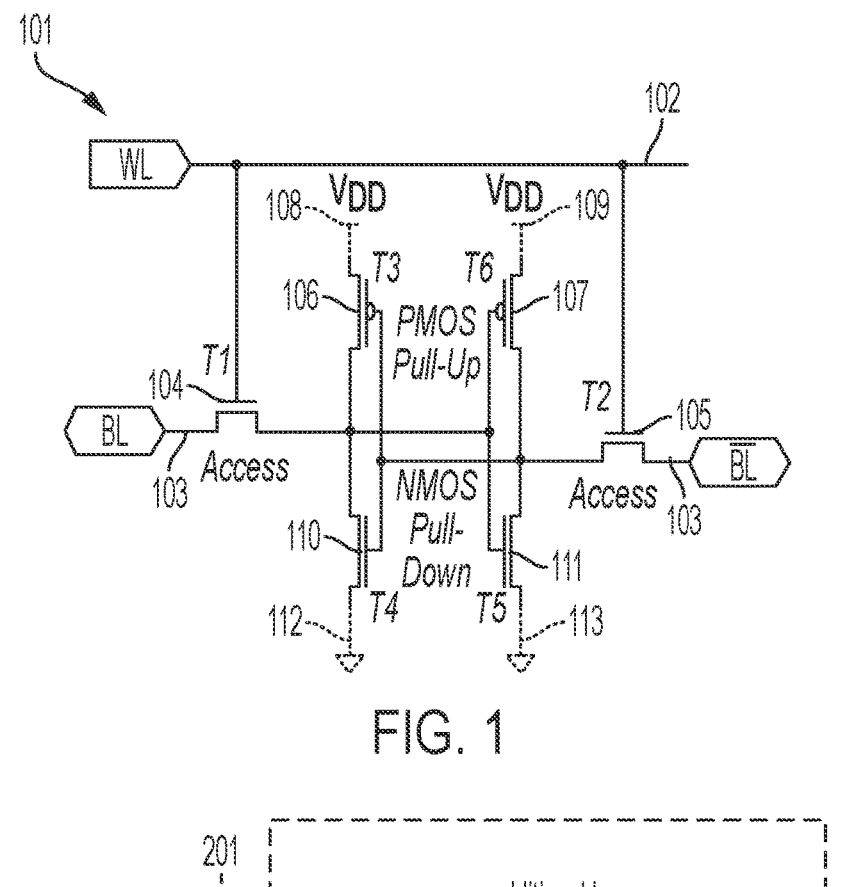
FIG. 1 is a schematic circuit diagram of a memory cell in accordance with one or more embodiments of the present invention.

Turning now to a more detailed description of aspects of the present invention, FIG. 1 depicts a memory cell structure 101 with an array of transistors. The memory cell structure 101 has a word line 102 and two bit lines 103 and includes first and second transistors 104 and 105 that are each operably connected to the word line 102. One of the first and second transistors 104 and 105 is operably connected to one of the bit lines 103 and the other is operably connected to another one of the bit lines 103. The first and second transistors 104 and 105 can be provided as n-doped access transistors or NFETs. The array of transistors in the memory cell structure 101 can further include first and second pull-up transistors 106 and 107 that are operably interposed between the first and second transistors 104 and 105 and that are connected to voltage terminals 108 and 109. The first and second pull-up transistors 106 and 107 can be provided as p-doped pull-up transistors or PFETs. The array of transistors in the memory cell structure 101 can also include first and second pull-down transistors 110 and 111 that are operably interposed between the first and second transistors 104 and 105 and that are connected to ground terminals 112 and 113. The first and second pull-down transistors 110 and 111 can be provided as NFETs.

Figure 2:
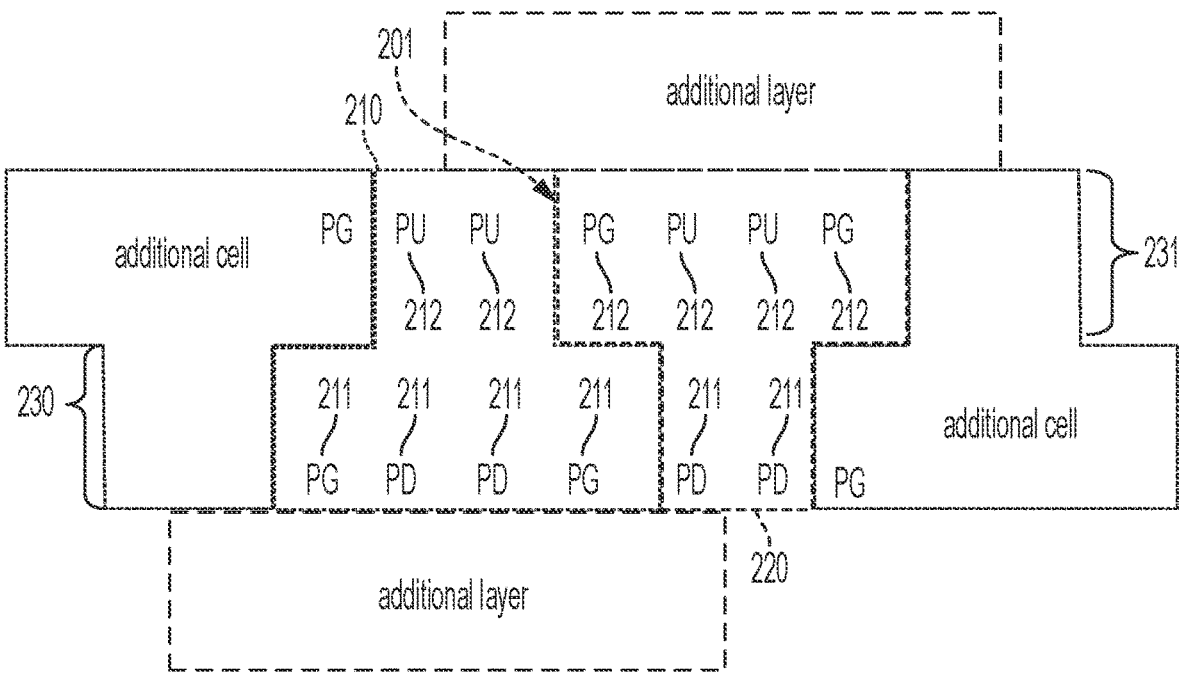
FIG. 2 is a schematic diagram of an FET cell structure in accordance with one or more embodiments of the present invention.

With reference to FIG. 2, the array of transistors in memory cell structure 101 of FIG. 1 can be arranged along with additional arrays of transistors in additional memory cell structures (other types of cell structures) in an IC in an FET cell structure 201.

The FET cell structure 201 includes a first cell 210 in which an array of transistors is provided and a second cell 220 in which an array of transistors is provided. The first cell 210 and the second cell 220 are adjacent and each of the first cell 210 and the second cell 220 spans a first layer 230 and a second layer 231. The second layer 231 is vertically stacked on the first layer 230 within the IC. The first cell 210 includes NFETs 211 on one of the first layer 230 and the second layer 231 and PFETs 212 on another of the first layer 230 and second layer 231. The second cell 220 includes NFETs 211 on the one of the first layer 230 and the second layer 231 and PFETs 212 on the other of the first layer 230 and second layer 231. In the second cell 220, a number of the NFETs 211 on the one of the first layer 230 differs from the number of the NFETs 211 in the first cell 210. Similarly, in the second cell 220, a number of the PFETs 212 on the other of the first layer 230 and second layer 231 differs from the number of the PFETs 212 in the first cell 210.

As shown in FIG. 2, owing to their respective constructions, the first cell 210 and the second cell 220 of the FET cell structure 201 are vertically complementary at least along their respective interior sides.

Although not shown in FIG. 2, it is to be understood that the FET cell structure 201 can have one or more additional layers and one or more additional cells. The first and second cells 210 and 220 and the one or more additional cells can span the first and second layers 230 and 231 as well as the one or more additional layers. The construction(s) of one or more additional cells can be vertically complementary with respect to the first and second cells 210 and 220 and to the other additional cells at least along their respective interior sides.

Figure 3:
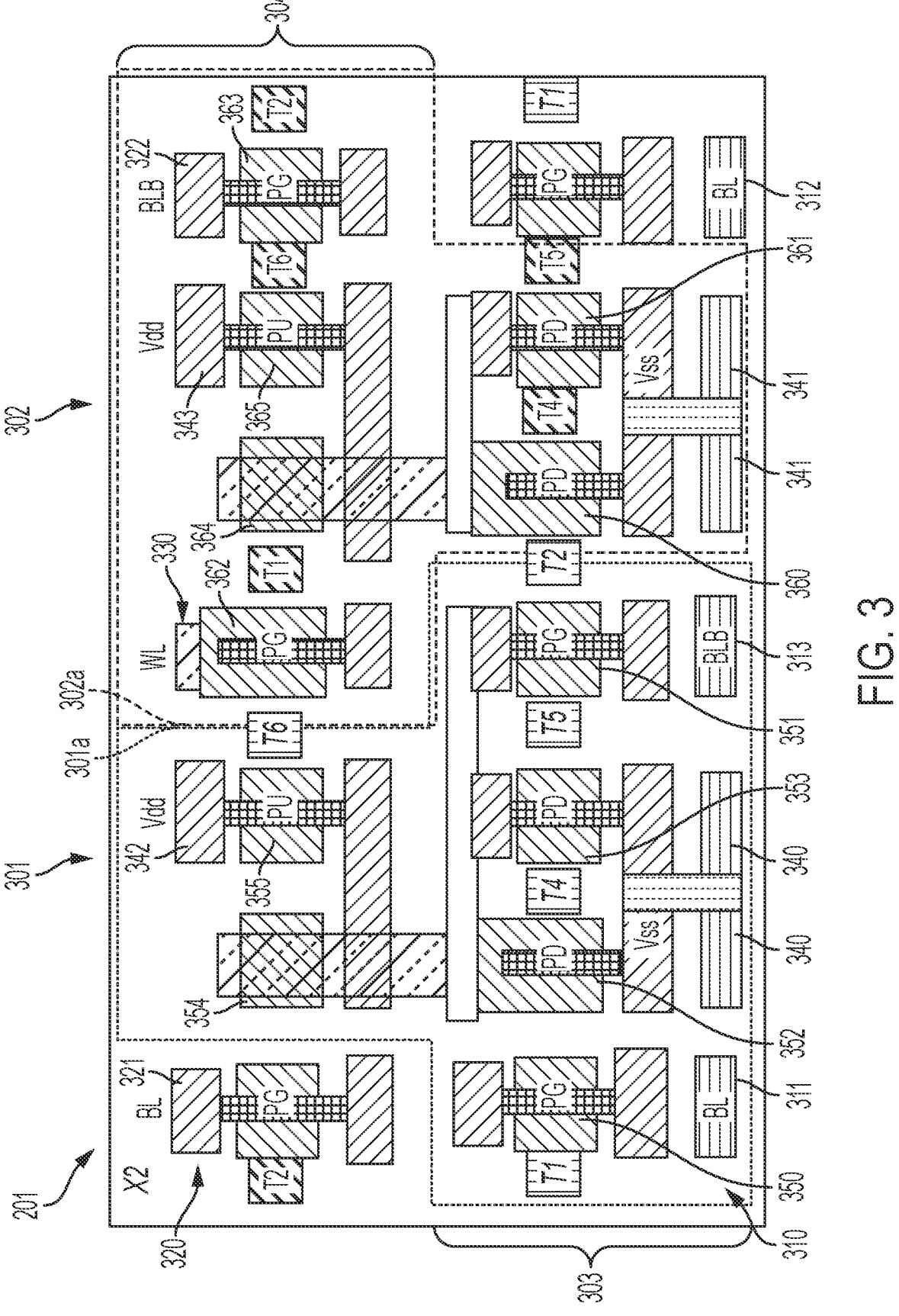
FIG. 3 is a detailed schematic diagram of the FET cell structure of FIG. 2 in accordance with one or more embodiments of the present invention.

With reference to FIG. 3, the FET cell structure 201 of FIG. 2 is shown in greater detail. As shown in FIG. 3, a first cell of the FET cell structure 201 can be provided as an NFET pass gate cell 301 and a second cell of the FET cell structure 201 can be provided as a PFET pass gate cell 302. The NFET pass gate cell 301 and the PFET pass gate cell 302 can be of a same function type or they can be separately operable.

The NFET pass gate cell 301 and the PFET pass gate cell 302 are vertically complementary along at least their respective interior sides 301a and 302a. The FET cell structure 201 includes a first layer 303 and a second layer 304. The NFET pass gate cell 301 spans both the first layer 303 and the second layer 304. The PFET pass gate cell 302 also spans both the first layer 303 and the second layer 304. The FET cell structure 201 also includes a first bit line 310, a second bit line 320 and a word line 330. The first bit line 310 can be provided in multiple parts including a first bit line section 311 in the NFET pass gate cell 301, a second bit line section 312 and a bit line bar 313 in the NFET pass gate cell 301. The second bit line 320 can be similarly provided in multiple parts including a first bit line section 321 and a bit line bar 322 in the PFET pass gate cell 302. The FET cell structure 201 can be fabricated on a backside metal ground plane of the IC to form ground terminals 340 and ground terminals 341 in the NFET pass gate cell 301 and the PFET pass gate cell 302, respectively, and the FET cell structure 201 can further include voltage terminals 342 and voltage terminals 343 in the NFET pass gate cell 301 and the PFET pass gate cell 302, respectively.

In accordance with one or more embodiments of the present invention, the first bit line 310 and the second bit line 320 can have different bit line voltage pre-charge capabilities. In addition, the first bit line 310 can be associated with a front side or a back side of the NFET pass gate cell 301 and the second bit line 320 can be associated with the back side or the front side of the PFET pass gate cell 302 or vice versa. Also, the word line 330 can be provided as multiple or first and second different word lines having different word line voltages.

In accordance with one or more embodiments of the present invention, the NFET pass gate cell 301 can include two NFET pass gate or access transistors 350 and 351 sandwiching two NFET pull-down transistors 352 and 353 on the first layer 303 (for a total of four NFETs on the first layer 303) as well as two PFET or pull-up transistors 354 and 355 on the second layer 304 (for a total of two PFETs on the second layer 304). The two NFET pass gate or access transistors 350 and 351 are communicative with the first bit line section 311 and the bit line bar 313, respectively, and the two NFET pull-down transistors 352 and 353 are each communicative with the ground terminals 340. The two PFET or pull-up transistors 354 and 355 are communicative with the four NFETs on the first layer 303 and with the voltage terminals 342. In accordance with one or more further embodiments of the present invention, the PFET pass gate cell 302 can include two NFET pull-down transistors 360 and 361 on the first layer 303 (for a total of two NFETs on the first layer 303) as well as two PFET pass gate or access transistors 362 and 363 sandwiching two PFET pull-up transistors 364 and 365 on the second layer 304 (for a total of four PFETs on the second layer 304). The two NFET pull-down transistors 360 and 361 are communicative with the four PFETs on the second layer 304 and with the ground terminals 341. The two PFET pass gate or access transistors 362 and 363 are communicative with the second bit line section 312 and the word line 330 and the two PFET pull-up transistors 364 and 365 are communicative with the voltage terminals 343.

Thus, a set of the NFETs of the NFET pass gate cell 301 are NFET pass gates and another set of the NFETs are NFET pull-down gates whereas a set of the PFETs of the NFET pass gate cell 301 are pull-up gates. Similarly, a set of the PFETs of the PFET pass gate cell 302 are PFET pass gates and another set of the PFETs are pull-up gates whereas a set of the NFETs of the PFET pass gate cell 302 are pull-down gates.

While the NFET pass gate cell 301 has four total NFETs on the first layer 303 (and two PFETs on the second layer 304) and the PFET pass gate cell 302 has two NFETs on the first layer 303 (and four total PFETs on the second layer 304) in the embodiments of FIG. 3, it is to be understood that this is not required and that other embodiments are possible. For example, the numbers of the NFETs and the PFETs in the NFET pass gate cell 301 and the PFET pass gate cell 302 can be increased or decreased as long as the NFET pass gate cell 301 and the PFET pass gate cell 302 remain vertically complementary (i.e., the NFET pass gate cell 301 and the PFET pass gate cell 302 can have a 4/2:2/4 configuration, a 5/2:2/5 configuration, a 6/2:2/6 configuration, etc.). As another example, as noted above, there could be one or more additional layers in the FET cell structure 201 and the NFET pass gate cell 301 and the PFET pass gate cell 302 can include additional NFETs and PFETs on the one or more additional layers (i.e., the NFET pass gate cell 301 and the PFET pass gate cell 302 can have a 6/4/2:2/4/6 configuration, a 8/5/2:2/5/8 configuration, a 10/6/2:2/6/10 configuration, etc.). Additionally, the FET cell structure 201 can include one or more additional cell structures that can be configured similarly as the NFET pass gate cell 301 and the PFET pass gate cell 302 with vertical complementary structure (i.e., the NFET pass gate cell 301, the PFET pass gate cell 302 and the additional cell structure(s) can have a 4/2:2/4:4/2 configuration, a 5/2:2/5:5/2 configuration, a 6/2:2/6:6/2 configuration, etc.).

Figure 4:
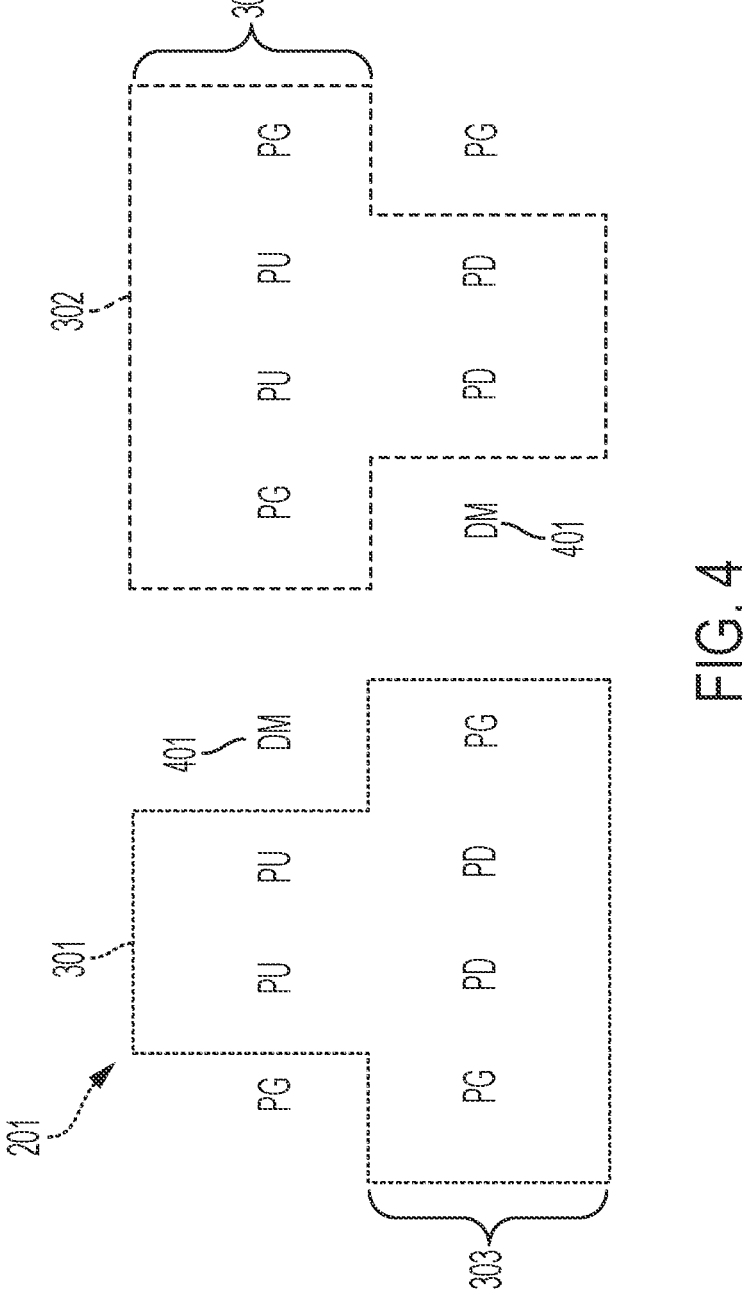
FIG. 4 is a schematic diagram of an FET cell structure with additional electronic devices in accordance with one or more embodiments of the present invention.

With reference to FIG. 4 and in accordance with one or more embodiments of the present invention, the FET cell structure 201 can further include additional electronic devices 401 on the first layer 303 and the second layer 304 and interposed between the NFET pass gate cell 301 and the PFET pass gate cell 302, which need not be adjacent. These additional electronic devices 401 can be dummy electronic devices or functional electronic devices that are shared between the NFET pass gate cell 301 and the PFET pass gate cell 302. As shown in FIG. 4, respective numbers or sizes of the additional electronic devices 401 on the first layer 303 and on the second layer 304 can be provided such that the vertical complementary nature of the NFET pass gate cell 301 and the PFET pass gate cell 302 is continued in the presence of the additional electronic devices 401. That is, the NFET pass gate cell 301, the PFET pass gate cell 302 and the additional electronic devices 401 are vertically complementary.

Figure 5:
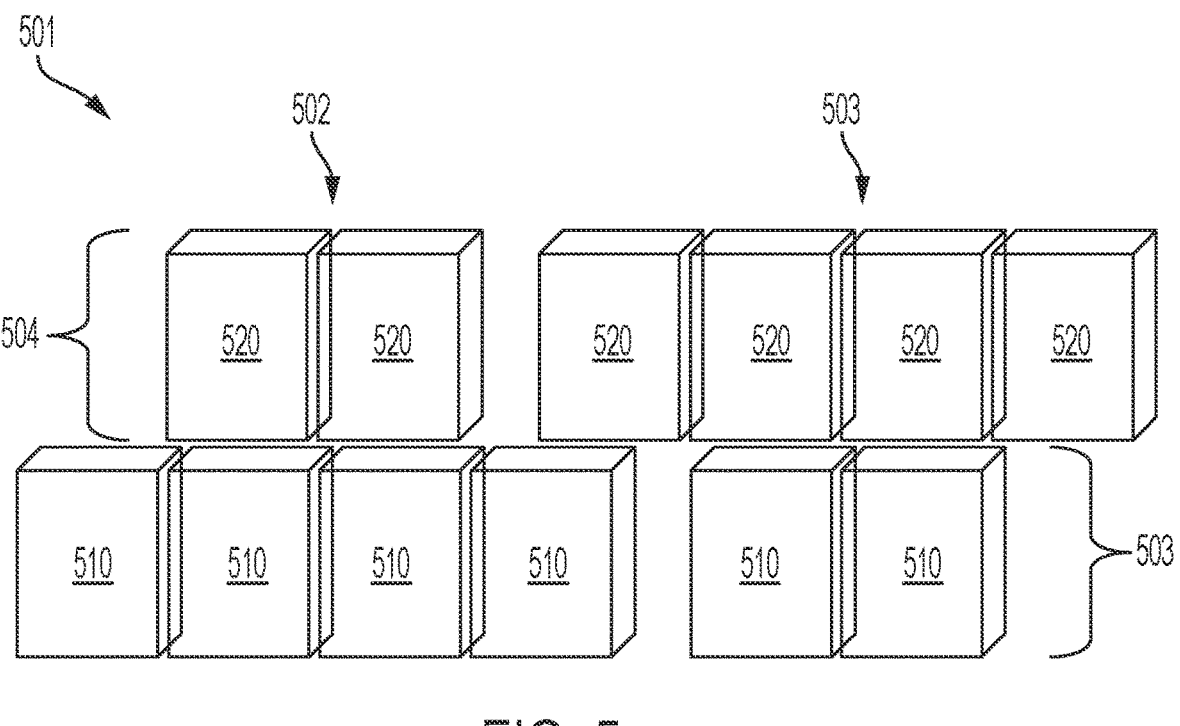
FIG. 5 is a schematic diagram of a static random-access-memory (SRAM) cell structure of a first type in accordance with one or more embodiments of the present invention.
Figure 6:
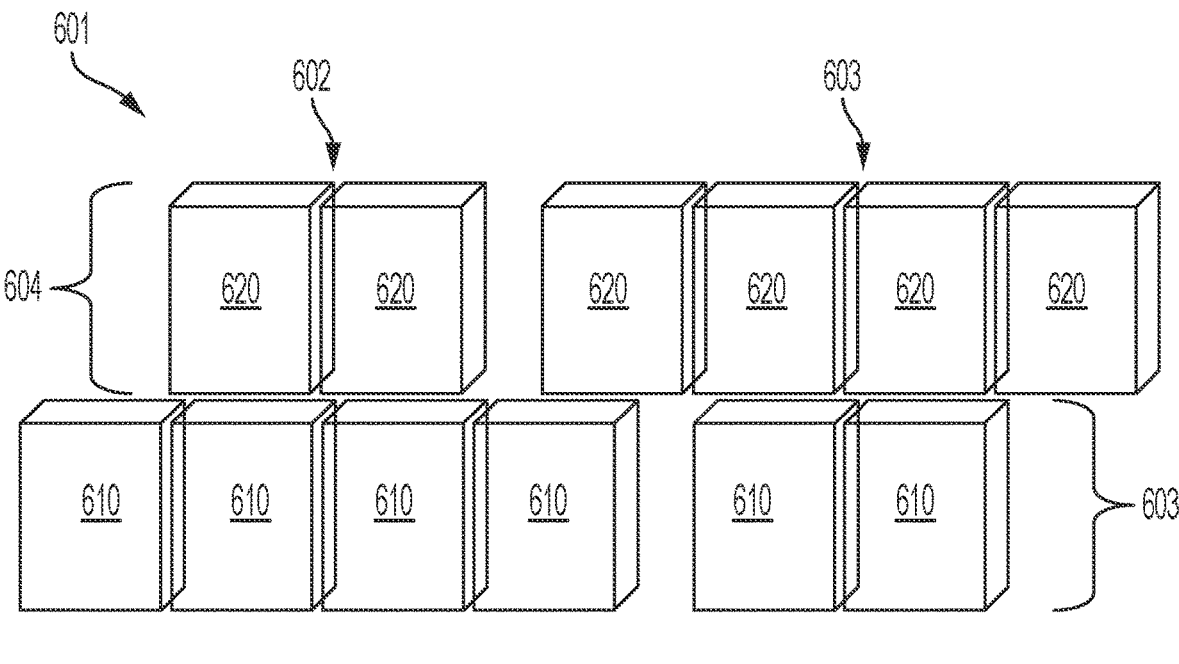
FIG. 6 is a schematic diagram of a static random-access-memory (SRAM) cell structure of a second type in accordance with one or more embodiments of the present invention.
Figure 7:
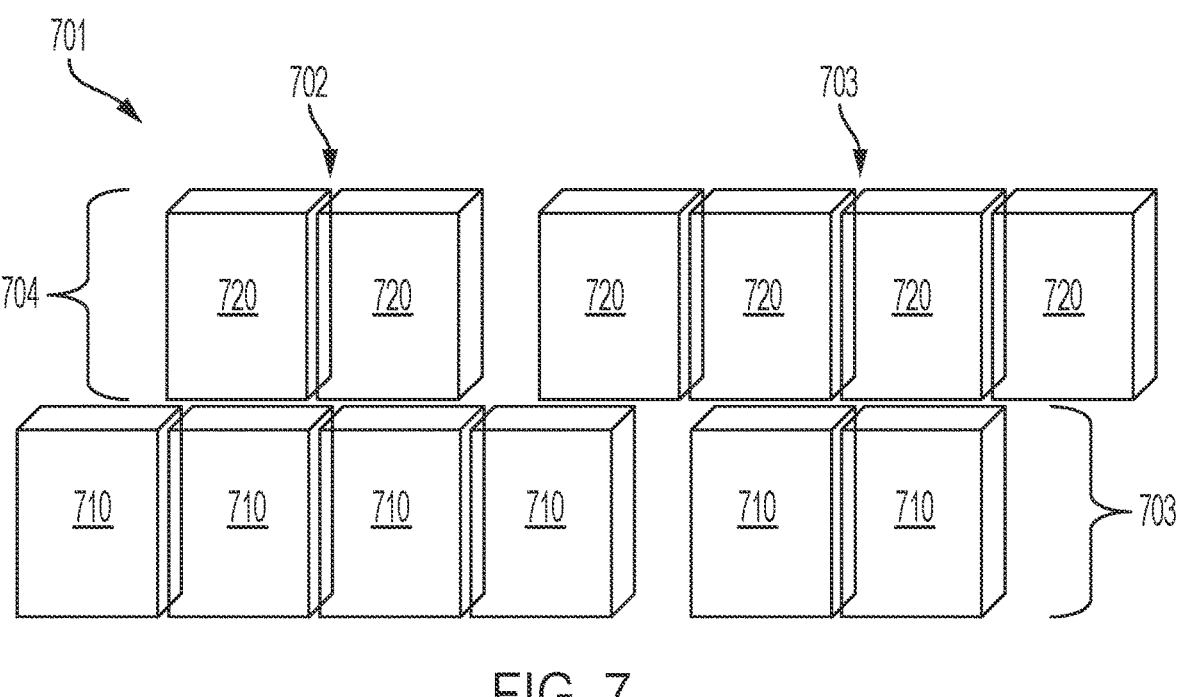
FIG. 7 is a schematic diagram of a ternary content addressable memory (TCAM) cell structure in accordance with one or more embodiments of the present invention.

With continued reference to FIGS. 2-4 and with additional reference to FIGS. 5-7, it is to be understood that the cell structures described above need not be limited to FET cell structures and that other options and configurations are possible. That is, a cell structure of an integrated circuit (IC) is provided and can be configured as one or more of an SRAM cell 501 (see FIG. 5) of a first type, an SRAM cell 601 (see FIG. 6) of a second type and a ternary content addressable memory (TCAM) cell 701 (see FIG. 7).

As shown in FIG. 5, the SRAM cell 501 of the first type includes first and second vertically complementary and adjacent cells 502 and 503, each spanning a first layer 504 and a second layer 505 vertically stacked on the first layer 504. The first cell 502 includes first electronic devices 510 on one of the first layer 504 and the second layer 505 and second electronic devices 520 on another of the first layer 504 and the second layer 505. The second cell 503 includes at least one of a number of first electronic devices 510 on the one of the first layer 504 and the second layer 505 differing from a number of the first electronic devices 510 in the first cell 502 and a number of second electronic devices 520 on the another of the first layer 504 and the second layer 505 differing from a number of the second electronic devices 520 in the first cell 502. In accordance with embodiments, the first electronic devices 510 can include or be provided as NFETs and the second electronic devices 520 can include or be provided as PFETs.

As shown in FIG. 6, the SRAM cell 601 of the second type includes first and second vertically complementary and adjacent cells 602 and 603, each spanning a first layer 604 and a second layer 605 vertically stacked on the first layer 604. The first cell 602 includes first electronic devices 610 on one of the first layer 604 and the second layer 605 and second electronic devices 620 on another of the first layer 604 and the second layer 605. The second cell 603 includes at least one of a number of first electronic devices 610 on the one of the first layer 604 and the second layer 605 differing from a number of the first electronic devices 610 in the first cell 602 and a number of second electronic devices 620 on the another of the first layer 604 and the second layer 605 differing from a number of the second electronic devices 620 in the first cell 602. In accordance with embodiments, the first electronic devices 610 can include or be provided as transistors and the second electronic devices 620 can include or be provided as resistors or resistive elements.

As shown in FIG. 7, the TCAM cell 701 of the second type includes first and second vertically complementary and adjacent cells 702 and 703, each spanning a first layer 704 and a second layer 705 vertically stacked on the first layer 704. The first cell 702 includes first electronic devices 710 on one of the first layer 704 and the second layer 705 and second electronic devices 720 on another of the first layer 704 and the second layer 705. The second cell 703 includes at least one of a number of first electronic devices 710 on the one of the first layer 704 and the second layer 705 differing from a number of the first electronic devices 710 in the first cell 702 and a number of second electronic devices 720 on the another of the first layer 704 and the second layer 705 differing from a number of the second electronic devices 720 in the first cell 702. In accordance with embodiments, the first electronic devices 710 can include or be provided as transistors and the second electronic devices 720 can include or be provided as capacitors or capacitive elements.

Technical benefits of the one or more embodiments of the present invention described above provide for arrangements of numbers of electronic devices in an IC, such as the numbers of NFETs and PFETs in a cell structure of an SRAM cell, for example, to be optimized for spatial considerations and facilitates achieving desired levels of miniaturization.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A field effect transistor (FET) cell structure of an integrated circuit (IC), the FET cell structure comprising:
   first cells and second cells, each second cell being disposed adjacent to at least one of the first cells and each of the first and second cells spanning a first layer and a second layer vertically stacked on the first layer,
   each of the first cells comprising n-doped FETs (NFETs) on one of the first and second layers and p-doped FETs (PFETs) on another of the first and second layers, and
   each of the second cells comprising at least one of:
   a number of NFETs on the one of the first and second layers differing from a number of the NFETs in the first cell; and
   a number of PFETs on the another of the first and second layers differing from a number of the PFETs in the first cell,
   wherein, for each adjacent pair first and second cells:
   on one of the first and second layers, both opposite sides of the first cell extend beyond both corresponding opposite sides of the first cell on the other of the first and second layers and form first opposite facing steps,
   on the other one of the first and second layers, both opposite sides of the second cell extend beyond both corresponding opposite sides of the second cell on the one of the first and second layers and form second opposite facing steps, and
   complementary ones of the first opposite facing steps and the second opposite facing steps of the first and second cells are vertically complementary.

2. The FET cell structure according to claim 1, wherein a set of the NFETs of each of the first cells are NFET pass gates and a set of the PFETs of each of the second cells are PFET pass gates.

3. The FET cell structure according to claim 1, wherein each of the first cells has four NFETs and each of the second cells has two NFETs.

4. The FET cell structure according to claim 3, wherein each of the first cells has the four NFETs and two PFETs and each of the second cells has the two NFETs and four PFETs.

5. The FET cell structure according to claim 1, wherein the first cells and the second cells are of a same function type or are separately operable.

6. The FET cell structure according to claim 1, further comprising first and second bit lines having different bit line voltage pre-charge capabilities, the first bit line being associated with the first cells and the second bit line being associated with the second cells.

7. The FET cell structure according to claim 1, further comprising first and second bit lines, the first bit line being associated with a front side or a back side of the first cells and the second bit line being associated with the back side or the front side of the second cells.

8. The FET cell structure according to claim 1, further comprising first and second different word lines having different word line voltages, the first word line being associated with the first cells and the second word line being associated with the second cells.

9. The FET cell structure according to claim 1, wherein:
   each adjacent pair of the first and second adjacent cells comprises one or more additional layers, and
   the first cells and the second cells each further comprise complementary numbers of NFETs and PFETs on the one or more additional layers.

10. A field effect transistor (FET) cell structure of an integrated circuit (IC), the FET cell structure comprising:

first cells, each spanning a first layer and a second layer vertically stacked on the first layer, and second cells, each spanning the first layer and the second layer, the first cell comprising n-doped FETs (NFETs) on one of the first and second layers and p-doped FETs (PFETs) on another of the first and second layers, and the second cell comprising at least one of:

a number of NFETs on the one of the first and second layers differing from a number of the NFETs in the first cell; and a number of PFETs on the another of the first and second layers differing from a number of the PFETs in the first cell; and additional electronic devices on the first and second layers and interposed between the first and second cells, the first and second cells and the additional electronic devices being vertically complementary, wherein, for each pair first and second cells with the additional electronic devices interposed therebetween:

on one of the first and second layers, both opposite sides of the first cell extend beyond both corresponding opposite sides of the first cell on the other of the first and second layers and form first opposite facing steps, on the other one of the first and second layers, both opposite sides of the second cell extend beyond both corresponding opposite sides of the second cell on the one of the first and second layers and form second opposite facing steps, and complementary ones of the first opposite facing steps of the first cell and the corresponding one of the additional electronic devices and of the second opposite facing steps of the second cell and the corresponding one of the additional electronic devices are vertically complementary.

11. The FET cell structure according to claim 10, wherein the additional electronic devices are shared between the first and second cells.

* * * * *